United States Patent
Lee et al.

(10) Patent No.: US 9,624,575 B2
(45) Date of Patent: Apr. 18, 2017

(54) THIN FILM DEPOSITION APPARATUS, DEPOSITION METHOD USING THE SAME, AND METHOD OF MANUFACTURING ORGANIC LIGHT-EMITTING DISPLAY APPARATUS BY USING THE APPARATUS

(71) Applicant: SAMSUNG DISPLAY CO., LTD., Yongin, Gyeonggi-Do (KR)

(72) Inventors: Ung-Soo Lee, Yongin (KR); Jin-Woo Park, Yongin (KR); Su-Hyuk Choi, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 162 days.

(21) Appl. No.: 14/262,088

(22) Filed: Apr. 25, 2014

(65) Prior Publication Data
US 2015/0031151 A1    Jan. 29, 2015

(30) Foreign Application Priority Data
Jul. 25, 2013 (KR) .......................... 10-2013-0088270

(51) Int. Cl.
| | | |
|---|---|---|
| H01L 23/10 | (2006.01) | |
| H01L 23/12 | (2006.01) | |
| C23C 14/50 | (2006.01) | |
| C23C 14/34 | (2006.01) | |
| H01L 51/56 | (2006.01) | |
| H01L 51/00 | (2006.01) | |
| H01J 37/34 | (2006.01) | |
| H01L 21/687 | (2006.01) | |
| H01J 37/32 | (2006.01) | |

(52) U.S. Cl.
CPC ........ *C23C 14/505* (2013.01); *C23C 14/3407* (2013.01); *H01J 37/32715* (2013.01); *H01J 37/3405* (2013.01); *H01L 21/68764* (2013.01); *H01L 21/68785* (2013.01); *H01L 21/68792* (2013.01); *H01L 51/001* (2013.01); *H01L 51/56* (2013.01)

(58) Field of Classification Search
CPC .......... H01L 21/3144; H01L 21/67103; H01L 21/67109; H01L 21/68764; H01L 21/68785; H01L 21/68792; H01L 51/0008
USPC ................ 257/676, 678, 711, 731, E21.499, 257/E33.058
See application file for complete search history.

(56) References Cited

U.S. PATENT DOCUMENTS

| | | | |
|---|---|---|---|
| 2002/0062791 A1* | 5/2002 | Ginovker et al. .... | C23C 14/505 118/728 |
| 2004/0089534 A1 | 5/2004 | Takahashi | |
| 2007/0114122 A1* | 5/2007 | Ishibashi et al. ... | C23C 14/0617 204/192.1 |

FOREIGN PATENT DOCUMENTS

| | | |
|---|---|---|
| KR | 10-2003-0076020 A | 9/2003 |
| KR | 10-2007-0054108 | 5/2007 |
| KR | 10-2007-0074020 A | 7/2007 |

* cited by examiner

Primary Examiner — Kyoung Lee
Assistant Examiner — Joannie A Garcia
(74) Attorney, Agent, or Firm — Lee & Morse, P.C.

(57) ABSTRACT

A thin film deposition apparatus, a deposition method using the same, and a method of manufacturing an organic light-emitting display apparatus by using the apparatus are provided. A thin film deposition apparatus is provided that includes a chamber containing a substrate holder on which a substrate is mounted, a plurality of rotary shaft units that change rotation and an inclination angle of the substrate holder, and a target unit that supplies a thin film material for formation on the substrate.

11 Claims, 5 Drawing Sheets

THIN FILM DEPOSITION APPARATUS, DEPOSITION METHOD USING THE SAME, AND METHOD OF MANUFACTURING ORGANIC LIGHT-EMITTING DISPLAY APPARATUS BY USING THE APPARATUS

CROSS-REFERENCE TO RELATED APPLICATION

Korean Patent Application No. 10-2013-0088270, filed on Jul. 25, 2013, in the Korean Intellectual Property Office, and entitled: "Thin Film Deposition Apparatus, Deposition Method Using The Same, and Method Of Manufacturing Organic Light-Emitting Display Apparatus By Using The Apparatus" is incorporated by reference herein in its entirety.

BACKGROUND

1. Field

One or more embodiments of the present disclosure relate to a thin film deposition apparatus improving a coverage property of a thin film, a deposition method using the thin film deposition apparatus, and a method of manufacturing an organic light-emitting display apparatus by using the thin film deposition apparatus.

2. Description of the Related Art

An organic light-emitting display apparatus, including a thin film transistor (TFT), may be used as a display apparatus in mobile devices, such as digital cameras, video cameras, camcorders, mobile devices, ultra slim laptops, smartphones, and tablet personal computers (PCs); or electronic devices, such as ultra slim TVs. The organic light-emitting display apparatus includes a first electrode, a second electrode, and an intermediate layer disposed between the first and second electrodes; all of which are formed on a substrate. The organic light-emitting display apparatus includes a sealing unit, so as to protect the intermediate layer formed on the substrate.

A thin film, including the sealing unit, may be formed using various methods. For example, a deposition method, in which a thin film deposition apparatus such as a sputter may be used. During a process of forming a thin film by using a deposition method, a thin film, which is formed on a substrate, should have good coverage.

SUMMARY

According to one or more embodiments of the present disclosure, a thin film deposition apparatus may include a chamber containing a substrate holder on which a substrate may be mounted, a plurality of rotary shaft units that change rotation and an inclination angle of the substrate holder, and a target unit that supplies a thin film material for formation on the substrate.

The rotary shaft unit may include a main rotary shaft unit, which rotates the substrate in a direction, including a main rotary shaft, a fixed shaft coupled to the main rotary shaft, and a plurality of guide shafts coupled to the fixed shaft to be vertically movable, and supported by a surface of the substrate holder. The rotary shaft unit may also include a tilt rotary shaft unit, which changes the inclination angle of the substrate, including a tilt rotary shaft coupled to the main rotary shaft, and a plurality of rotary guide shafts coupled to the tilt rotary shaft and supported by a surface of the substrate holder.

The main rotary shaft may be connected to a main rotary motor and thus be rotatable. The fixed shaft may include a first connection shaft provided from an end of the main rotary shaft in a horizontal direction of the chamber, and a plurality of vertical shafts, which extend from the first connection shaft, to which the plurality of guide shafts are coupled to be vertically movable. The plurality of vertical shafts may include a first vertical shaft and a second vertical shaft that extend from respective ends of the first connection shaft in a vertical direction of the chamber. The plurality of guide shafts may include a first guide shaft and a second guide shaft. The first and second guide shafts may be respectively coupled to the first and second vertical shafts to be vertically movable in guide grooves formed in the first and second vertical shafts. A length of the first guide shaft may be equal to a length of the second guide shaft. A ring connector may be provided between the plurality of guide shafts and the substrate holder so that the substrate holder is movable with respect to the plurality of guide shafts.

A rotary member may be provided to the substrate holder. The tilt rotary shaft unit may be coupled to the rotary member to be able to be idle, and may change an inclination angle of the substrate by interworking with the plurality of guide shafts. The tilt rotary shaft may be coupled through an inner portion of the main rotary shaft, and may be connected to a tilt rotary motor and thus be rotatable. A second connection shaft may be provided on an end of the tilt rotary shaft in a horizontal direction of the chamber. The plurality of rotary guide shafts may extend from the second connection shaft and may be provided on the rotary member. The plurality of rotary guide shafts may include a first rotary guide shaft and a second rotary guide shaft that extend from respective ends of the second connection shaft in a vertical direction of the chamber. Lengths of the first and second rotary guide shafts may differ in a vertical direction. The rotary member may be arranged in the substrate holder in a circular shape. The first and second rotary guide shafts may be inserted through a coupling hole of the substrate holder, which is formed to correspond to a vertical direction of the rotary member, and thus may be disposed on the rotary member having a circular shape to be able to be idle. The rotary member may be a bearing device.

According to one or more embodiments of the present disclosure, a deposition method of a thin film deposition apparatus is provided. The method may include rotating a substrate fully or at an inclination angle, by respectively and independently rotating a main rotary shaft unit and a tilt rotary shaft unit that may be coupled to the main rotary shaft unit. The main rotary shaft unit and the tilt rotary shaft unit may support a substrate holder, on which the substrate, provided in a chamber, may be mounted. A voltage may be applied on a target unit provided in the chamber, thus forming plasma in the chamber. A deposition layer may be formed on the substrate.

The main rotary shaft unit may include a main rotary shaft, a fixed shaft coupled to the main rotary shaft, and a plurality of guide shafts coupled to the fixed shaft to be vertically movable and supported by a surface of the substrate holder. The main rotary shaft unit may fully rotate the substrate holder by rotation power of a main rotary motor that is connected to the main rotary shaft.

The tilt rotary shaft unit may be coupled to a rotary member provided on the substrate holder to be able to be idle by using a tilt rotary shaft coupled to the main rotary shaft, and a first rotary guide shaft and a second rotary guide shaft coupled to the tilt rotary shaft and having different lengths. The tilt rotary shaft unit may rotate the substrate holder at an inclination angle by using rotary power of a tilt rotary motor that is connected to the tilt rotary shaft. The rotary member may include a bearing device disposed in the substrate holder, and the first and second rotary guide shafts idle on the rotary member, and then the substrate may be inclined due to a difference between lengths of the first and second rotary guide shafts. The plurality of guide shafts may be vertically moved in an inner portion of the fixed shaft depending on a vertical motion location of the first rotary guide shaft or the second rotary guide shaft.

According to one or more embodiments of the present disclosure, a method of manufacturing an organic light-emitting display apparatus is provided. The method may include depositing a thin film on the substrate by using a method described herein and using an apparatus including a thin film transistor (TFT) formed on a substrate, and an organic light-emitting diode (OLED), electrically connected to the TFT. The OLED may include a first electrode, an intermediate layer including an organic emission layer, and a second electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
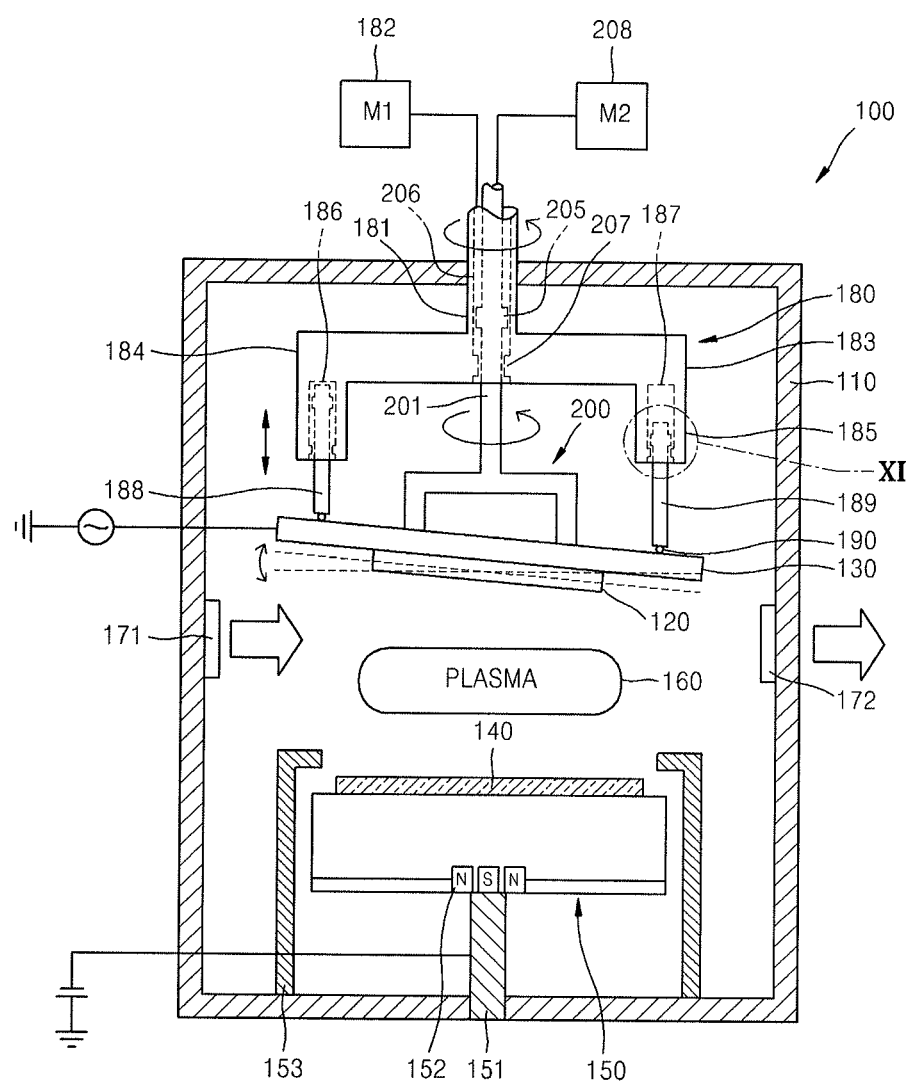
FIG. 1 illustrates a view schematically of a structure of a thin film deposition apparatus according to an embodiment of the present disclosure.

Reference is made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described by referring to the figures to explain aspects of the present description. It will be understood that although the terms "first," "second," and the like may be used herein to describe various components, these components should not be limited by these terms. These components are only used to distinguish one component from another.

The terminology used herein is for the purpose of describing particular embodiments only and is not intended to limit the spirit and scope of the present disclosure. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components. Expressions such as "at least one of," when preceding a list of elements, modify the entire list of elements and do not modify the individual elements of the list.

Figure 2A:
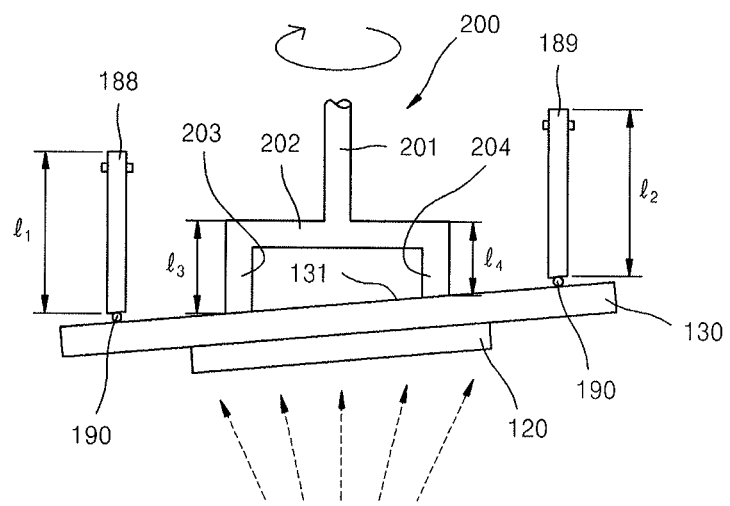
FIG. 2A illustrates a view of a state in which a tilt rotary shaft unit of FIG. 1 is rotated in a direction.
Figure 2B:
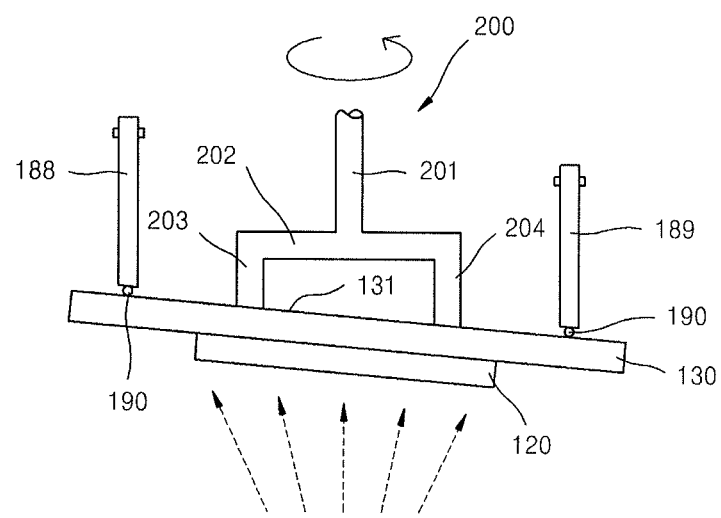
FIG. 2B illustrates a view of a state in which the tilt rotary shaft unit of FIG. 2A is rotated by 180°.
Figure 3A:
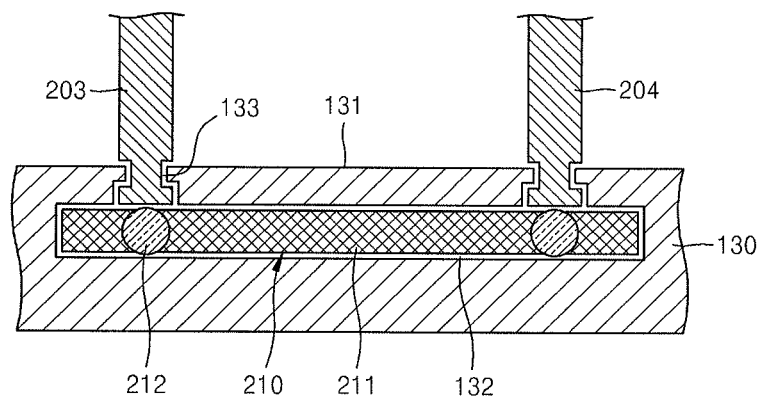
FIG. 3A illustrates a partial sectional view of a state in which rotary guide shafts are coupled to a substrate holder of FIG. 2A.
Figure 3B:
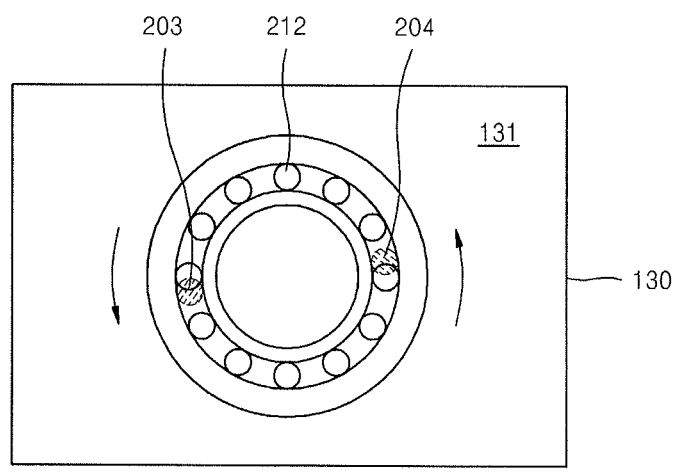
FIG. 3B illustrates a plan view of the substrate holder of FIG. 3A.

FIG. 1 illustrates a view schematically of a structure of a thin film deposition apparatus 100 according to an embodiment of the present disclosure. FIG. 2A illustrates a view of a state in which a tilt rotary shaft unit 200 of FIG. 1 may be rotated in a direction. FIG. 2B illustrates a view of a state in which the tilt rotary shaft unit 200 of FIG. 2A may be rotated by 180°. FIG. 3A illustrates a partial sectional view of a state in which first and second rotary guide shafts 203 and 204 may be coupled to a substrate holder 130 of FIG. 2A. FIG. 3B illustrates a plan view of the substrate holder 130 of FIG. 3A.

An example in which the thin film deposition apparatus 100 is a sputtering deposition apparatus is illustrated. In other implementations, the thin film deposition apparatus 100 may be one of other apparatuses that may form a thin film on a substrate, such as a thermal evaporation apparatus, a chemical vapor deposition apparatus, or an E-beam sputter. Referring to FIG. 1, a chamber 110 having a space for deposition is provided in the thin film deposition apparatus 100. The substrate holder 130, on which a substrate 120 is mounted, and a sputter cathode 150, on which a deposition target 140 is provided, are provided in the chamber 110.

According to the present embodiment, the substrate holder 130 may be provided in an upper portion of the chamber 110, and the sputter cathode 150 may be provided in a lower portion of the chamber 110. In other implementations, other locations of the substrate holder 130 and the sputter cathode 150 may be provided. The substrate holder 130 supports the substrate 120 that is supplied to the chamber 110. The substrate holder 130 may be supported by vacuum adsorbing a surface thereof that is opposite to a deposition surface of the substrate 120, or by using a clamp member. A heater may also be provided on the substrate holder 130. The heater may heat the substrate 120, so that plasma 160, which may be sputtered from the deposition target 140, may be more easily deposited on the substrate 120. The substrate holder 130 functions as an anode, and may be grounded.

The deposition target 140 may be disposed to face the substrate 120. The deposition target 140 may be formed of a material that is deposited on a surface of the substrate 120 by sputtering. According to the present embodiment, the deposition target 140 may be formed by using a material to form a barrier layer, such as an inorganic layer. The barrier layer may cover an organic light-emitting diode (OLED) that may include an intermediate layer and a plurality of electrodes. In other implementations, the deposition target 140 may be formed of metal, such as titanium or aluminum, depending on a thin film that is to be deposited on the substrate 120.

The deposition target 140 may be mounted on the sputter cathode 150. The sputter cathode 150 is coupled to a support shaft 151. According to the present embodiment, the sputter cathode 150 may be vertically moved or rotated by the support shaft 151. The sputter cathode 150 may include a magnet 152. A S pole may be disposed in the center of the magnet 152, and a N pole may be disposed to surround the S pole. The magnet 152 may form a magnetic field in the chamber 110. The magnet 152 may form a closed-loop magnetic field in the deposition target 140. The magnet 152 may adjust motion paths of electrons in the plasma particle 160, and may strongly limit the plasma particle 160 to move around the deposition target 140. The sputter cathode 150 may function as a cathode. In other implementations, the deposition target 140 may be attached to a backing plate having thermal conductivity, and a magnet may be provided on a rear surface of the backing plate. A shield 153 may be provided around the deposition target 140.

The plasma particle 160 may be formed in the chamber 110. By using the plasma particle 160, a deposition layer may be formed on the substrate 120 by sputtering deposition. In this case, reactive gas may be provided to form the plasma particle 160 may be argon gas, which is an active gas. Therefore, the plasma particle 160 may include argon gas. A gas supply unit 171 for supplying argon gas, which may be gas for sputtering, and a gas discharging unit 172 for controlling pressure inside the chamber 110 may be provided to the chamber 110. The gas supply unit 171 may provide a pathway for sputtering gas such as argon gas to flow into the chamber 110, according to a type of the deposition target 140. Sputtering gas may be ionized by generating a glow discharge in the chamber 110, and thus may be formed into a plasma state having high density. The gas discharging unit 172 may be coupled to a vacuum pump, and may form an inner portion of the chamber 110 into a vacuum state. In order to uniformly deposit deposition particles, which are formed when, for example, the plasma 160 collides with the deposition target 140, on the substrate 120, the thin film deposition apparatus 100 may include an apparatus that may change the full rotation and an inclination angle of the substrate 120.

Referring to FIGS. 1, 2A, 2B, 3A, and 3B, the substrate holder 130 may be coupled to a main rotary shaft unit 180. A main rotary shaft 181 may be provided in the main rotary shaft unit 180. The main rotary shaft 181 may be provided in a vertical direction of the chamber 110. The main rotary shaft 181 may be coupled to a main rotary motor M1 182, and thus may be rotated in a direction. A fixed shaft 183 may be coupled to an end of the rotary shaft 181. The fixed shaft 183 may be provided in a horizontal direction of the chamber 110. The fixed shaft 183 may be integrally formed with the main rotary shaft 181, or assembled with the main rotary shaft 181.

A plurality of vertical shafts, for example, first and second vertical shafts 184 and 185, may be provided on respective ends of the fixed shaft 183. The first vertical shaft 184 may be formed on an end of the fixed shaft 183, and the second vertical shaft 185 may be formed on the other end of the fixed shaft 183. The first and second vertical shafts 184 and 185 may extend from respective ends of the fixed shaft 183 in a vertical direction of the chamber 110. In the first vertical shaft 184, a first guide groove 186 may be formed along a longitudinal direction of the first vertical shaft 184. In the second vertical shaft 185, a second guide groove 187 may be formed along a longitudinal direction of the second vertical shaft 185.

A first guide shaft 188 may be inserted in the first guide groove 186. The first guide shaft 188 may be provided to be vertically movable in the first guide groove 186. A second guide shaft 189 may be inserted in the second guide groove 187. The second guide shaft 189 may be provided to be vertically movable in the second guide groove 187. A length 12 of the second guide shaft 189 may be equal to a length 11 of the first guide shaft 188 (see FIG. 2A). The first and second guide shafts 188 and 189 may be vertically movable by piston coupling and the like.

Figure 6:
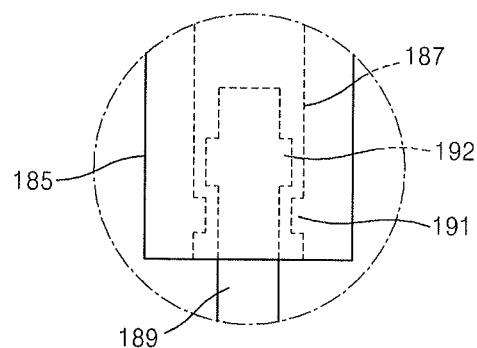
FIG. 6 illustrates an enlarged view of a state in which the rotary guide shaft is coupled to a vertical shaft of FIG. 1 as indicated by reference numeral XI.

As illustrated in FIG. 6, in lower portions of the first and second vertical shafts 184 and 185, a first protrusion 191 may protrude from an inner wall toward the first and second guide shafts 188 and 189. Also, a second protrusion 192 may protrude from outer peripheral surfaces of the first and second guide shafts 188 and 189. Accordingly, when, for example, the first and second guide shafts 188 and 189 are moved downward, a lower portion of the second protrusion 192 may be mounted on an upper portion of the first protrusion 191. Thus, the first and second guide shafts 188 and 189 need not be separated from the first and second vertical shafts 184 and 185.

Referring back to FIGS. 1, 2A, 2B, 3A, and 3B, the first and second guide shafts 188 and 189 may rotate when, for example, the main rotary shaft unit 180 is rotated. In a structure of which the first and second guide shafts 188 and 189 may be coupled to the main rotary shaft 180, a guide member may be coupled through a guide groove and may be rotated. An end of the first guide shaft 188 and an end of the second guide shaft 189 may be coupled to a rear surface 131 of the substrate holder 130. The first and second guide shafts 188 and 189 need not be fixed to the substrate holder 130, but may be coupled to the substrate holder 130 by using a connector 190 such as a ring member. If a connector coupling method is used, when, for example, an inclination angle of the substrate holder 130 is changed, a degree of freedom of the substrate holder 130 may be maintained.

The tilt rotary shaft unit 200 may be coupled to the rear surface 131 of the substrate holder 130. A tilt rotary shaft 201 may be provided in the tilt rotary shaft unit 200. The tilt rotary shaft 201 may be inserted in a main guide groove 206 of the main rotary shaft 181. The tilt rotary shaft 201 may be coupled to a tilt rotary motor M2 208, and thus may be rotated in a direction. Therefore, the main rotary shaft 181 and the tilt rotary shaft 201 may be independently rotated by rotation power respectively supplied from the main rotary motor M1 182 and the tilt rotary motor M2 208.

In the main rotary shaft 181, a first protrusion 207 may protrude from an inner wall toward the tilt rotary shaft 201. A second protrusion 205 may protrude from an outer peripheral surface of the tilt rotary shaft 201. Accordingly, a lower portion of the second protrusion 205 may be mounted on an upper portion of the first protrusion 207. Thus, during operation, the tilt rotary shaft 201 need not be separated from the first and second vertical shafts 184 and 185.

A connection shaft 202 may be coupled to an end of the tilt rotary shaft 201. The connection shaft 202 may be provided in a horizontal direction of the chamber 110. The connection shaft 202 may be integrally formed with the tilt rotary shaft 201, or assembled with to the tilt rotary shaft 201. The first rotary guide shaft 203 and the second rotary guide shaft 204 may be provided on respective ends of the connection shaft 202. The first rotary guide shaft 203 may be formed on an end of the connection shaft 202, and the second rotary guide shaft 204 may be formed on the other end of the connection shaft 202. The first and second rotary guide shafts 203 and 204 may extend from respective ends of the connection shaft 202 in a vertical direction of the chamber 110. An end of the first rotary guide shaft 203 and an end of the second guide shaft 204 may be coupled to the rear surface 131 of the substrate holder 130.

Lengths of the first and second rotary guide shafts 203 and 204 may be different. A length 13 in a vertical direction of the first rotary guide shaft 203 may be greater than a length 14 in a vertical direction of the second rotary guide shaft 204. Thus, due to the different lengths of the first and second rotary guide shafts 203 and 204, the substrate holder 130, which is supported by the first and second rotary guide shafts 203 and 204, may be disposed such that the substrate holder 130 may be inclined with respect to a horizontal direction of the chamber 110.

The first and second rotary guide shafts 203 and 204 may be coupled such that the first and second rotary guide shafts 203 and 204 may be idle on a rotary member 210 in the substrate holder 130. A space 132 may be formed in the substrate holder 130, and the rotary member 210 may be provided in the space 132. According to the present embodiment, the rotary member 210 may be a bearing device in which a plurality of ball bearings 212 may be provided in a circular shape in a bearing housing unit 211.

The first and second rotary guide shafts 203 and 204 may be coupled to the substrate holder 130 through a coupling hole 133, which may be circular and formed in the rear surface 131 of the substrate holder 130. An end of the first rotary guide shaft 203 and an end of the second rotary guide shaft 204 may be disposed on the ball bearings 212. The first and second rotary guide shafts 203 and 204 may be disposed to face each other in a radial direction. The first and second rotary guide shafts 203 and 204 may be idle on the ball bearings 212.

A process, in which the substrate 120 with the structure described herein may be fully rotated or at an inclination angle, and thus may be deposited, is described herein. First, when, for example, the tilt rotary motor M2 208 rotates, the tilt rotary shaft 201, which may be provided through an inner space of the main rotary shaft 181, may be rotated. When, for example, the tilt rotary shaft 201 is rotated in a direction, the connection shaft 202 coupled to an end of the tilt rotary shaft 201, and the first and second rotary guide shafts 203 and 204 coupled to respective horizontal ends of the connection shaft 202 may be thus rotated.

The first and second rotary guide shafts 203 and 204 may be coupled to the substrate holder 130 through the coupling hole 133 that may be circular and may be formed in the rear surface 131 of the substrate holder 130. An end of the first rotary guide shaft 203 and an end of the second rotary guide shaft 204 may contact the ball bearings 212. Thus, the first and second rotary guide shafts 204 and 204 may be idle on the ball bearings 212. The length 13 of the first rotary guide shaft 203 and the length 14 of the second rotary guide shaft 204 may be different. As illustrated in FIGS. 2A and 2B, when, for example, the first and second rotary guide shafts 203 and 204 are rotated at an inclination angle, the substrate holder 130, on which the substrate 120 is mounted, may be changed corresponding to traces of the first and second rotary guide shafts 203 and 204, due to the different lengths of the first and second rotary guide shafts 203 and 204.

Because the inclination angle of the substrate holder 130 may be changed, the first and second guide shafts 188 and 189 coupled to edges of the rear surface 131 of the substrate holder 130, are selectively and vertically moved in the first and second guide grooves 186 and 187, respectively, formed in the first and second vertical shafts 184 and 185 that are coupled to the main rotary shaft 181. Also, the substrate holder 130 may be coupled to the first and second guide shafts 188 and 189, having a degree of freedom due to the ring connector 190. Thus, the substrate holder 130 may be inclined by a predetermined angle, according to a rotation direction of the first and second rotary guide shafts 203 and 204 with different lengths. Accordingly, as the first and second rotary guide shafts 203 and 204 are rotated, an angle of the substrate holder 130 may be continuously changed to a positive (+) or a negative (−) angle. Then, an angle of atoms that are incident on the substrate 120 may be changed, and thus, a coverage property of a thin film may be improved.

When, for example, the main rotary motor M1 182 rotates, the main rotary shaft 181 may be rotated. When, for example, the main rotary shaft 181 may be rotated in a direction, the fixed shaft 183 coupled to an end of the main rotary shaft 181, and the first and second vertical shafts 184 and 185 coupled to respective horizontal ends of the fixed shaft 183 may be rotated. When, for example, the first and second vertical shafts 184 and 185 are rotated, the first and second guide shafts 188 and 189, which are coupled to the first and second guide grooves 186 and 187 formed in the first and second vertical shafts 184 and 185, may be simultaneously rotated. Thus, the substrate holder 130, which may be coupled to the first and guide shafts 188 and 189 by the connector 190, may be rotated.

The main rotary shaft unit 180 and the tilt rotary shaft unit 200 may be independently rotated. Thus, the substrate holder 130 may be rotated by the main rotary shaft unit 180, and may be rotated having an inclination angle due to the tilt rotary shaft unit 200. Also, the main rotary shaft unit 180 and the tilt rotary shaft unit 200 may be independently rotated. Accordingly, each revolutions per minute (rpm) of the main rotary shaft unit 180 and the tilt rotary shaft unit 200 may be adjusted to obtain an optimal coverage property of a thin film. In addition, in the chamber 110, a separate auxiliary target unit may be provided in a horizontal direction. Then, because deposition is possible in a horizontal direction, a coverage property of a thin film may be further improved.

Figure 4A:
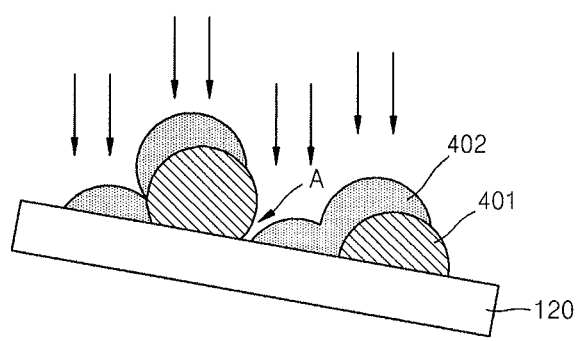
FIG. 4A illustrates a view of a deposition state on a substrate, in a rotation state of FIG. 2A.
Figure 4B:
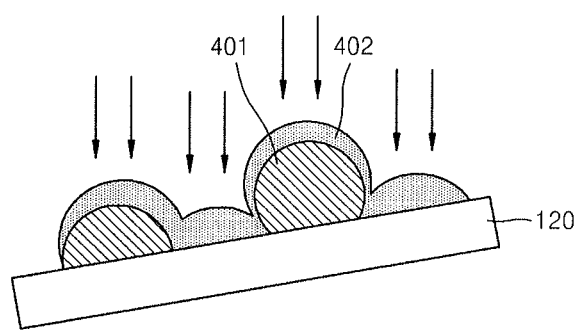
FIG. 4B illustrates a view of a deposition state on a substrate, in a rotation state of FIG. 2B.

A process of depositing the deposition target 140 on the substrate 120 by using the thin film deposition apparatus 100 is described with reference to FIGS. 4A and 4B. Referring to FIG. 4A, if the substrate 120 may be inclined by an angle, an acute angle portion A, which is formed by the substrate 120 and a first particle 401, may become a blind area and have defects. However, according to the present embodiment, when, for example the substrate holder 130 is rotated by 180°, as illustrated in FIG. 4B, an angle of the substrate 120 may be changed, and thus, atoms 402 may reach the acute angle portion A. Accordingly, a coverage property of a thin film may be improved.

Figure 5:
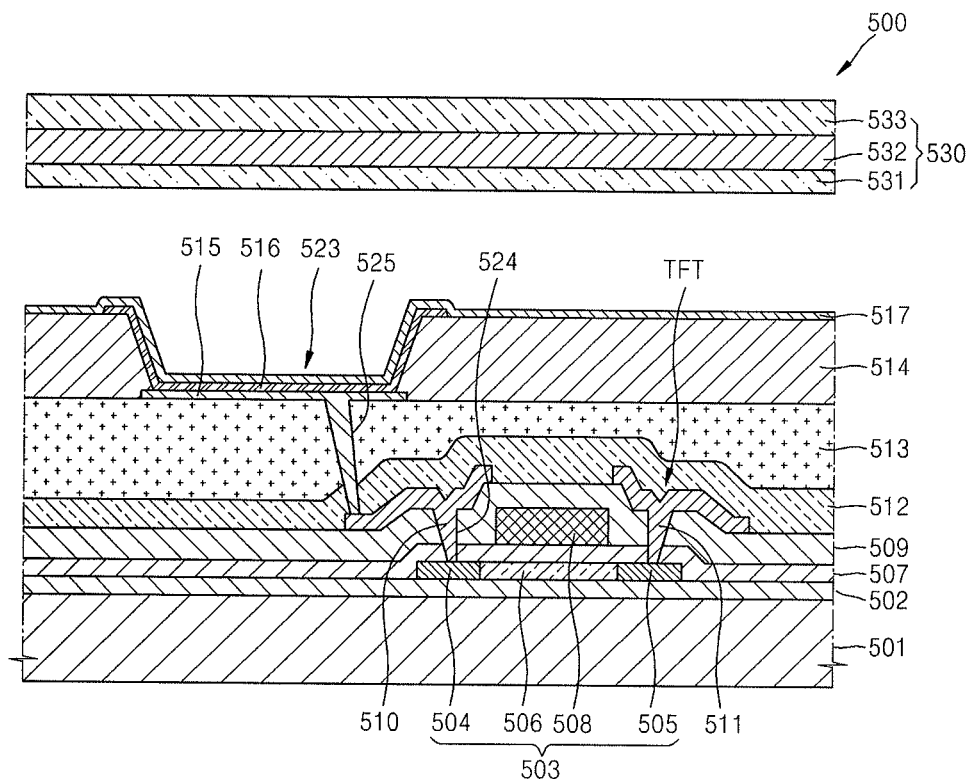
FIG. 5 illustrates a cross-sectional view of a sub-pixel of an organic light-emitting display apparatus that is manufactured by using the thin film deposition apparatus according to an embodiment of the present disclosure.

FIG. 5 illustrates a cross-sectional view of a sub-pixel of a display apparatus, such as an organic light-emitting display apparatus 500, which may be manufactured by using the thin film deposition apparatus 100 as described herein. Sub-pixels may include at least one of a thin film transistor (TFT), and an OLED. The TFT may be formed as a structure illustrated in FIG. 5. The number of TFTs and the structure of the TFT may be modified in various ways. Referring to FIG. 5, a substrate 501 may be provided in the organic light-emitting display apparatus 500. The substrate 501 may be formed of an insulative material, such as glass or plastic. A buffer layer 502 may be formed on the substrate 501. The buffer layer 502 may have a structure formed by using an organic layer or an inorganic layer, or by alternately stacking an organic layer and an inorganic layer. The buffer layer 502 may prevent oxygen or moisture from penetrating into the OLED.

A semiconductor active layer 503 having a predetermined pattern may be formed on the buffer layer 502. The semiconductor active layer 503 may be formed of polycrystalline silicon, for example. The semiconductor active layer 503 may be formed of an oxide semiconductor. For example, the oxide semiconductor may include a metal element in Groups 12 to 14, such as metal zinc (Zn), indium (In), gallium (Ga), tin (Sn), cadmium (Cd), germanium (Ge), or hafnium (Hf), or an oxide of a material selected from a combination thereof. The semiconductor active layer 503 may be doped with n-type or p-type impurity ions, and thus, a source area 504 and a drain area 505 may be formed on the semiconductor active layer 503. An area between the source and drain areas 504 and 505 may be a channel area 506 that is not doped with impurities.

A gate insulating layer 507 may be formed on the semiconductor active layer 503. The gate insulating layer 507 may be formed as a single layer formed of $SiO_2$, or a double layer formed of $SiO_2$ and $SiN_x$. A gate electrode 508 may be formed in a predetermined region of the gate insulating layer 507. The gate electrode 508 may be connected to a gate line via which an ON or OFF signal of the TFT is applied. The gate electrode 508 may be formed by using metal or a metal alloy. The gate electrode 508 may be formed as a single layer including molybdenum (Mo), molybdenum-tungsten (MoW), chromium (Cr), an aluminum (Al) alloy, magnesium (Mg), nickel (Ni), tungsten (W), gold (Au), or a multi-layer including a combination thereof.

An interlayer insulating layer 509 is formed on the gate electrode 507. A source electrode 510 may be electrically connected to the source area 504 via a contact hole 524 that may be formed by removing a portion of the interlayer insulating layer 509. A drain electrode 511 may be electrically connected to the drain area 505 via the contact hole. The interlayer insulating layer 509 may be formed of an insulative material, such as $SiO_2$ and $SiN_x$, or an insulative organic material.

A passivation layer 512, which may be formed of $SiO_2$ or $SiN_x$, may be formed on the source and drain electrodes 510 and 511. The passivation layer 512 may be formed by just using an organic material. A planarization layer 513, which may be formed of an organic material, such as acryl, polyimide, or benzocyclobutene (BCB), may be formed on the passivation layer 512.

A first electrode 515 of the OLED may be formed on the planarization layer 513. The first electrode 515 may be electrically connected to either one of the source electrode 510 and the drain electrode 511 via a contact hole 525 that may be formed by removing a portion of the planarization layer 513. Among electrodes included in the OLED, the first electrode 515 may function as an anode, and may be formed of various materials. The first electrode 515 may be formed as a transparent electrode or a reflective electrode, according to properties of the OLED. When, for example, the first electrode 515 is formed as a transparent electrode, the first electrode 515 may include indium tin oxide (ITO), indium zinc oxide (IZO), zinc oxide (ZnO), or indium oxide ($In_2O_3$). When, for example, the first electrode 515 is formed as a reflective electrode, a reflective layer may be formed by using silver (Ag), Mg, Al, platinum (Pt), palladium (Pd), Au, Ni, neodymium (Nd), iridium (Ir), Cr, or a compound thereof, and then, ITO, IZO, ZnO, or $In_2O_3$ may be formed on the reflective layer.

An opening 523 may be formed on the planarization layer 513, so as to externally expose at least a portion of the first electrode 515. A pixel-defining layer (PDL) 514, which may cover an edge of the first electrode 515, may be formed around the opening 523. The PDL 514 may be an insulating layer, and may define a light-emission area of each sub-pixel by surrounding an edge of the first electrode 515. The PDL 514 may be formed of an organic material or an inorganic material. For example, the PDL 514 may be formed of an organic material, such as polyimide, polyamide, BCB, acrylic resin, or phenol resin, or an inorganic material, such as $SiN_x$. The PDL 514 may be formed as a single layer or a multi-layer, and may be modified in various ways.

An intermediate layer 516 may be formed on the first electrode 515 that may be externally exposed through the opening 523. The intermediate layer 516 may be formed by using a deposition process. In the present embodiment, the intermediate layer 516 is illustrated as a pattern that may correspond just to each sub-pixel, that is, the first electrode 515 that may be patterned. However, the illustration is only for convenience of description to describe a configuration of a sub-pixel. The intermediate layer 516 may be integrally formed with other adjacent sub-pixels. Also, some intermediate layers 516 may be formed for each sub-pixel, and the intermediate layer 516 may be integrally formed throughout adjacent sub-pixels. The intermediate layer 516 may be modified in various ways.

The intermediate layer 516 may be formed of a low-molecular weight organic material or a polymer organic material. For example, when the intermediate layer 516 may be formed of a low-molecular weight organic material, the intermediate layer 516 includes an emissive layer (EML). In other implementations, the intermediate layer 516 may include the EML, and at least one of a hole injection layer (HIL), a hole transport layer (HTL), an electron transport layer (ETL), and an electron injection layer (EIL). The intermediate layer 516 may further include the EML and other various functional layers. When, for example, the intermediate layer 516 is formed of a polymer organic material, the intermediate layer 516 may include an HTL and an EML. The polymer organic material may be formed by using a screen printing method or an inkjet printing method.

A second electrode 517 may be formed on the intermediate layer 516. Like the first electrode 515, the second electrode 517 may be formed as a transparent electrode or a reflective electrode. When, for example, the second electrode 517 is formed as a transparent electrode, a metal having a low work function, such as lithium (Li), calcium (Ca), LiF/Ca, LiF/Al, Al, Mg, or a compound thereof, may be deposited on the intermediate layer 516. Then, an auxiliary electrode, which is formed of a material for forming a transparent electrode, such as ITO, IZO, ZnO, or $In_2O_3$, may be formed on the metal. When, for example, the second electrode 517 is formed as a reflective electrode, the second electrode 517 may be formed by depositing Li, Ca, LiF/Ca, LiF/Al, Al, Ag, Mg, or a compound thereof on part of or the entire area of the organic light-emitting display apparatus 500.

When, for example, the first electrode 515 is formed as a transparent electrode or a reflective electrode, the first electrode 515 may be formed just in the opening 523 of each sub-pixel. On the other hand, the second electrode 517 may be formed by depositing a transparent electrode or a reflective electrode on part of or an entire display area of the organic light-emitting display apparatus 500. In other implementations, one need not deposit the second electrode 517 on the entire area of the substrate 501. The second electrode 517 may be formed to have various patterns. In addition, the first and second electrodes 515 and 517 may be stacked in opposite positions to each other.

As described herein, the OLED may include the first electrode 515, the second electrode 517, and the intermediate layer 516 that may include an organic emission layer and may be disposed between the first and second electrodes 515 and 517. The first and second electrodes 515 and 517 may be insulated from each other by the intermediate layer 516.

The intermediate layer 516 may emit light by applying voltages having different polarities to the intermediate layer 516.

A sealing unit 530 may be formed on the second electrode 517. The sealing unit 530 may have a structure of which at least one organic layer or at least one inorganic layer are stacked. For example, the sealing unit 530 may have a structure of which at least one organic layer 532 may be formed of a material, such as epoxy, polyimide, polyethylene terephthalate, polycarbonate, polyethylene, and/or polyacrylate; and at least one of inorganic layers 531 and 533 may be formed of a material, such as $SiO_2$, $SiN_x$, aluminum oxide ($Al_2O_3$), titanium oxide ($TiO_2$), zirconium oxide ($ZrO_x$), and/or zinc oxide (ZnO), may be stacked. The sealing unit 530 may have a structure of at least one organic layer 532 and at least two inorganic layers 531 and 533.

By way of summation, according to one or more of the embodiments of the present disclosure, in a thin film deposition apparatus, a deposition method that uses the same, and a method of manufacturing an organic light-emitting display apparatus by using the apparatus, a substrate may be rotated, and at the same time, a thin film may be deposited on the substrate while an angle of the substrate may be changed. Thus, a thin film having uniform thickness may be deposited on the substrate, and accordingly, a coverage property of a thin film may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A thin film deposition apparatus comprising a chamber containing:
   a substrate holder on which a substrate is mounted;
   a plurality of rotary shaft units above the substrate holder that change rotation and an inclination angle of the substrate holder; and
   a target unit below the substrate holder that supplies a thin film material for formation on the substrate.

2. A thin film deposition apparatus comprising a chamber containing:
   a substrate holder on which a substrate is mounted;
   a plurality of rotary shaft units that change rotation and an inclination angle of the substrate holder; and
   a target unit that supplies a thin film material for formation on the substrate,
   wherein the rotary shaft units include:
   a main rotary shaft unit, which rotates the substrate in a direction, the main rotary shaft unit including a main rotary shaft, a fixed shaft coupled to the main rotary shaft, and a plurality of guide shafts coupled to the fixed shaft to be vertically movable and supported by a surface of the substrate holder; and
   a tilt rotary shaft unit, which changes the inclination angle of the substrate, the tilt rotary shaft including a tilt rotary shaft coupled to the main rotary shaft and a plurality of rotary guide shafts coupled to the tilt rotary shaft and supporting a surface of the substrate holder.

3. The thin film deposition apparatus as claimed in claim 2, wherein:
   the main rotary shaft is connected to a main rotary motor and thus is rotatable, and
   the fixed shaft includes a first connection shaft provided from an end of the main rotary shaft in a horizontal direction of the chamber, and a plurality of vertical shafts that extend from the first connection shaft, to which the plurality of guide shafts are coupled to be vertically movable.

4. The thin film deposition apparatus as claimed in claim 3, wherein:
   the plurality of vertical shafts include a first vertical shaft and a second vertical shaft that extend from respective ends of the first connection shaft in a vertical direction of the chamber, and
   the plurality of guide shafts include a first guide shaft and a second guide shaft, and the first and second guide shafts being respectively coupled to the first and second vertical shafts to be vertically movable in guide grooves formed in the first and second vertical shafts.

5. The thin film deposition apparatus as claimed in claim 4, wherein a length of the first guide shaft is equal to a length of the second guide shaft.

6. The thin film deposition apparatus as claimed in claim 3, wherein a ring connector is provided between the plurality of guide shafts and the substrate holder, such that the substrate holder is movable with respect to the plurality of guide shafts.

7. The thin film deposition apparatus as claimed in claim 2, wherein:
   a rotary member is provided to the substrate holder,
   the tilt rotary shaft unit is coupled to the rotary member to be able to be idle, and
   the tilt rotary shaft changes an inclination angle of the substrate by interworking with the plurality of guide shafts.

8. The thin film deposition apparatus as claimed in claim 7, wherein:
   the tilt rotary shaft is coupled through an inner portion of the main rotary shaft, and is connected to a tilt rotary motor and thus is rotatable,
   a second connection shaft is provided on an end of the tilt rotary shaft in a horizontal direction of the chamber, and
   the plurality of rotary guide shafts extend from the second connection shaft and are provided on the rotary member.

9. The thin film deposition apparatus as claimed in claim 8, wherein:
   the plurality of rotary guide shafts include a first rotary guide shaft and a second rotary guide shaft that extend from respective ends of the second connection shaft in a vertical direction of the chamber, and
   lengths of the first and second rotary guide shafts differ in a vertical direction.

10. The thin film deposition apparatus as claimed in claim 9, wherein:
    the rotary member is arranged in the substrate holder in a circular shape, and
    the first and second rotary guide shafts are inserted through a coupling hole of the substrate holder that is formed to correspond to a vertical direction of the rotary member, and thus are disposed on the rotary member having a circular shape to be able to be idle.

11. The thin film deposition apparatus as claimed in claim 10, wherein the rotary member is a bearing device.

* * * * *